(12) United States Patent
Kim et al.

(10) Patent No.: US 11,322,579 B2
(45) Date of Patent: May 3, 2022

(54) METAL-INSULATOR-METAL (MIM) CAPACITOR AND SEMICONDUCTOR DEVICE

(71) Applicant: SAMSUNG ELECTRONICS CO., LTD., Suwon-si (KR)

(72) Inventors: Song Yi Kim, Yongin-si (KR); Junghyun Cho, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 113 days.

(21) Appl. No.: 16/661,414

(22) Filed: Oct. 23, 2019

(65) Prior Publication Data

US 2020/0273946 A1 Aug. 27, 2020

(30) Foreign Application Priority Data

Feb. 21, 2019 (KR) .......................... 10-2019-0020606

(51) Int. Cl.
*H01L 49/02* (2006.01)
*H01L 23/522* (2006.01)
(Continued)

(52) U.S. Cl.
CPC ............ *H01L 28/60* (2013.01); *H01L 23/528* (2013.01); *H01L 23/5226* (2013.01); *H01L 27/2427* (2013.01); *H01L 27/2463* (2013.01); *H01L 45/06* (2013.01); *H01L 45/08* (2013.01); *H01L 45/1233* (2013.01); *H01L 45/1253* (2013.01); *H01L 45/143* (2013.01); *H01L 45/144* (2013.01); *H01L 45/146* (2013.01); *H01L 45/147* (2013.01)

(58) Field of Classification Search
None
See application file for complete search history.

(56) References Cited

U.S. PATENT DOCUMENTS

| 6,486,558 B2 | 11/2002 | Sugiyama et al. |
| 6,841,880 B2 | 1/2005 | Matsumoto et al. |

(Continued)

FOREIGN PATENT DOCUMENTS

| JP | 4138684 | 8/2008 |
| JP | 4222979 | 2/2009 |

(Continued)

*Primary Examiner* — Daniel Whalen
(74) *Attorney, Agent, or Firm* — F. Chau & Associates, LLC

(57) ABSTRACT

A semiconductor device includes a substrate and memory cell arrays arranged on the substrate in a first direction and second direction. The first direction and second direction are parallel to a top surface of the substrate and intersect each other. The memory cell arrays include a plurality of memory cells. A cell dummy pattern on the substrate is arranged between the memory cell arrays in at least one of the first direction and second direction and extends along a side of the memory cell arrays. A cell conductive pattern is included on the substrate. A cell contact plug is configured to connect the cell dummy pattern and the cell conductive pattern. The cell contact plug is arranged between the cell dummy pattern and the cell conductive pattern in a third direction that is perpendicular to the first direction and the second direction.

20 Claims, 10 Drawing Sheets

(51) Int. Cl.
*H01L 27/24* (2006.01)
*H01L 23/528* (2006.01)
*H01L 45/00* (2006.01)

(56) References Cited

U.S. PATENT DOCUMENTS

| | | |
|---|---|---|
| 6,867,070 B2 | 3/2005 | Cho et al. |
| 7,294,932 B2 | 11/2007 | Hiroi |
| 8,502,341 B2 | 8/2013 | Lee et al. |
| 9,898,639 B2 | 2/2018 | Lee |
| 2014/0091430 A1 | 4/2014 | Nagai |
| 2016/0336327 A1 | 11/2016 | Park et al. |
| 2018/0158827 A1 | 6/2018 | You et al. |
| 2020/0075481 A1* | 3/2020 | Yoshimori .......... H01L 23/5226 |

FOREIGN PATENT DOCUMENTS

| | | |
|---|---|---|
| JP | 4615846 | 1/2011 |
| KR | 10-2002-0031491 | 5/2002 |
| KR | 100649968 | 11/2006 |
| KR | 10-2007-0081704 | 8/2007 |
| KR | 10-2011-0002335 | 1/2011 |

\* cited by examiner

METAL-INSULATOR-METAL (MIM) CAPACITOR AND SEMICONDUCTOR DEVICE

CROSS-REFERENCE TO RELATED APPLICATION

This patent application claims priority under 35 U.S.C. § 119 to Korean Patent Application No. 10-2019-0020606, filed on Feb. 21, 2019 in the Korean Intellectual Property Office, the disclosure of which is incorporated by reference in its entirety herein.

TECHNICAL FIELD

Embodiments of the inventive concepts relate to a metal-insulator-metal (MIM) capacitor and a semiconductor device, and more particularly, to a MIM capacitor including a dummy pattern, and a semiconductor device.

DISCUSSION OF RELATED ART

Semiconductor devices are widely used in various electronic industries because of their numerous advantages including small sizes, multi-functional characteristics, and low manufacturing costs. Semiconductor devices may include memory devices that store logical data, logic devices that process logical data, and hybrid devices having the functionality of both a memory device and a logic device.

There has been an increasing demand for semiconductor devices having high performance characteristics as the electronic industry has advanced. For example, there has been an increased demand for semiconductor devices having improved speed and/or reliability. However, as semiconductor devices have been highly integrated, the widths of patterns in the semiconductor devices have been reduced. Due to the reduction in the width of the patterns, it may be difficult to realize or manufacture semiconductor devices having a high speed or reliability.

SUMMARY

Exemplary embodiments of the present inventive concepts may provide a semiconductor device capable of improving a yield and reliability.

In an exemplary embodiment of the present inventive concepts, a semiconductor device may include a substrate and memory cell arrays arranged on the substrate in a first direction and second direction. The first direction and second direction are parallel to a top surface of the substrate and intersect each other. The memory cell arrays include a plurality of memory cells. A cell dummy pattern on the substrate is arranged between the memory cell arrays in at least one of the first direction and second direction and extends along a side of the memory cell arrays. A cell conductive pattern is included on the substrate. A cell contact plug is configured to connect the cell dummy pattern and the cell conductive pattern. The cell contact plug is arranged between the cell dummy pattern and the cell conductive pattern in a third direction that is perpendicular to the first direction and the second direction.

In an exemplary embodiment of the present inventive concepts, a metal-insulator-metal (MIM) capacitor may include a first electrode, a second electrode, and an insulator between the first electrode and the second electrode. Each of the first and second electrodes comprises a dummy pattern disposed between memory cell arrays horizontally arranged on an insulating layer. A contact plug penetrates the insulating layer to connect the dummy pattern and a conductive pattern under the insulating layer. The insulator is a portion of the insulating layer between the first and second electrodes.

In an exemplary embodiment of the present inventive concepts, a method for manufacturing a semiconductor device includes forming memory cell arrays on a substrate in a first direction and a second direction. The first direction and second direction are parallel to a top surface of the substrate and intersect each other. The memory cell arrays include a plurality of memory cells. A cell dummy pattern is formed on the substrate between the memory cell arrays in at least one of the first direction and the second direction and extends along a side of the memory cell arrays. A cell conductive pattern is formed on the substrate. A cell contact plug is formed between the cell dummy pattern and the cell conductive pattern in a third direction that is perpendicular to the first direction and the second direction. The cell contact plug electrically connects the cell dummy pattern and the cell conductive pattern.

BRIEF DESCRIPTION OF THE DRAWINGS

The present inventive concepts will become more apparent in view of the attached drawings and accompanying detailed description.

DETAILED DESCRIPTION OF THE EXEMPLARY EMBODIMENTS

Semiconductor devices according to exemplary embodiments of the present inventive concepts will be described hereinafter in detail with reference to the accompanying drawings.

Figure 1:
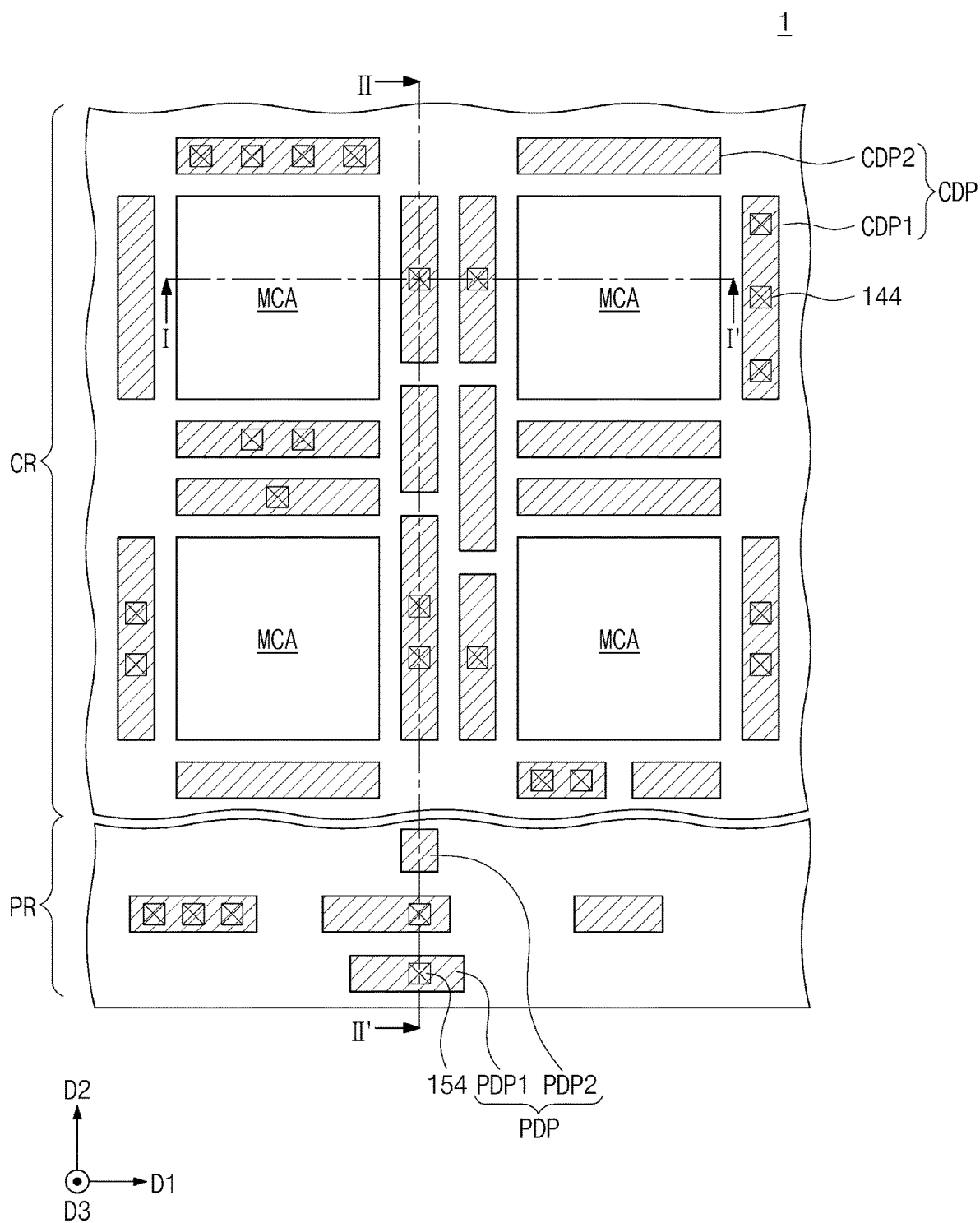
FIG. 1 is a plan view illustrating a semiconductor device according to an exemplary embodiment of the present inventive concepts.

FIG. 1 is a plan view illustrating a semiconductor device 1 according to an exemplary embodiment of the present inventive concepts. In some exemplary embodiments, a semiconductor device 1 may be a variable resistance memory device. However, exemplary embodiments of the present inventive concepts are not limited thereto. In certain exemplary embodiments, the semiconductor device 1 may be one of other various kinds of memory devices such as a dynamic random access memory (DRAM) device, a magnetic random access memory (MRAM) device, etc.

The semiconductor device 1 may include a cell region CR and a peripheral region PR. One or more memory cell arrays MCA may be disposed in the cell region CR. The cell region CR may be an active region including the memory cell arrays MCA. In an exemplary embodiment, the memory cell arrays MCA may be horizontally disposed on a substrate 100 (e.g., extending parallel to the top surface of the substrate 100). Each of the memory cell arrays MCA may include memory cells MC. The peripheral region PR may include peripheral circuits. In some exemplary embodiments, the peripheral circuits may include circuits necessary for driving the memory cell arrays MCA. For example, the peripheral circuits may include a row decoder, a page buffer, a latch circuit, a cache circuit, a sense amplifier, a data input/output circuit, etc.

Figure 2:
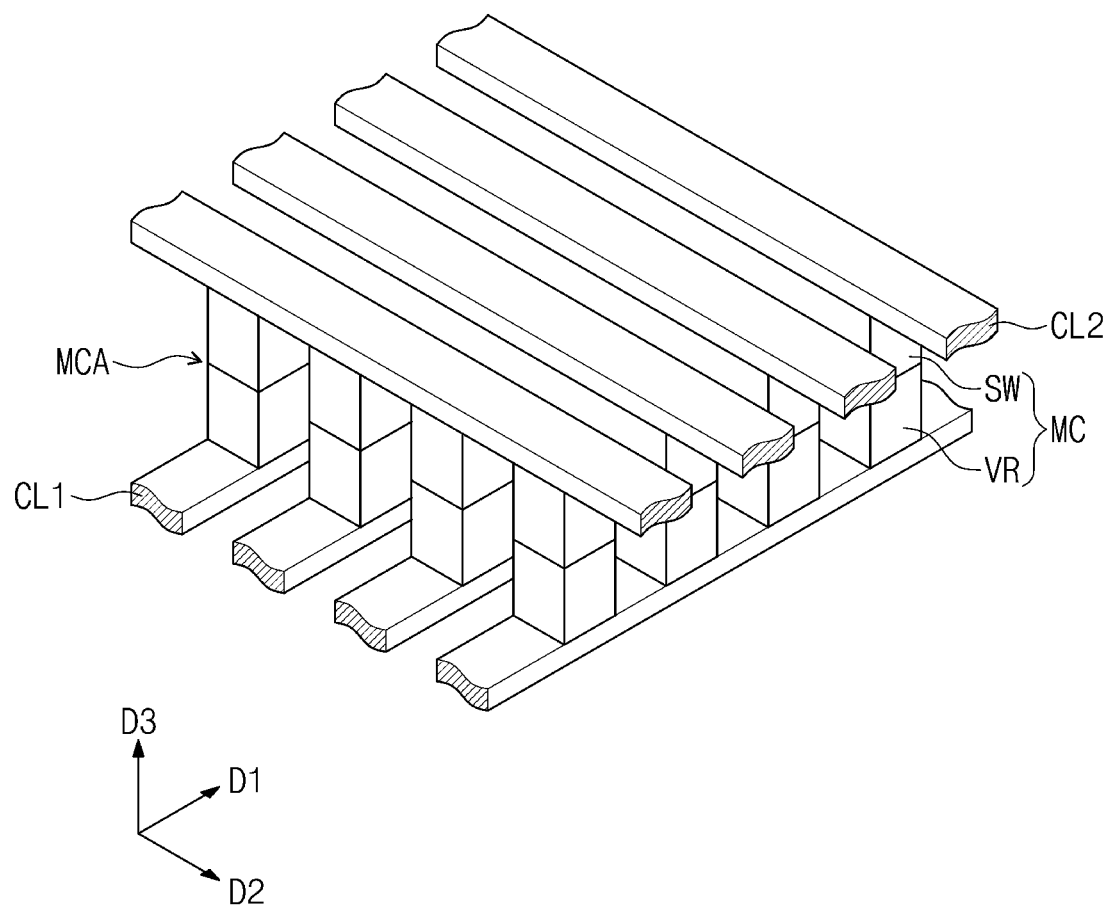
FIG. 2 is a perspective view illustrating a memory cell array according to an exemplary embodiment of the present inventive concepts.

FIG. 2 is a perspective view illustrating the memory cell array MCA according to an exemplary embodiment of the present inventive concepts. Referring to FIG. 2, first conductive lines CL1 and second conductive lines CL2 may be provided. The first conductive lines CL1 may extend in a first direction D1, and the second conductive lines CL2 may extend in a second direction D2 intersecting the first direction D1. The first direction D1 and the second direction D2 may be parallel to a top surface of the substrate 100 and may intersect each other. The second conductive lines CL2 may be spaced apart from the first conductive lines CL1 in a third direction D3 perpendicular to the first and second directions D1 and D2.

The memory cell array MCA may be provided between the first conductive lines CL1 and the second conductive lines CL2. For example, the memory cell array MCA may include a plurality of discrete memory cells MC that are provided at intersection points of the first conductive lines CL1 and the second conductive lines CL2, respectively. The memory cells MC may be two-dimensionally arranged to constitute rows arranged in the second direction D2 and extending in the first direction D1 and columns arranged in the first direction D1 and extending in the second direction D2. In the present specification, the first conductive lines CL1 may be referred to as lower interconnection lines, and the second conductive lines CL2 may be referred to as upper interconnection lines. However, exemplary embodiments of the present inventive concepts are not limited thereto and the second conductive lines CL2 may be disposed under the first connection lines CL1.

Each of the memory cells MC may include a variable resistance structure VR and a switching element SW. The variable resistance structure VR and the switching element SW may be connected in series to each other between the conductive lines CL1 and CL2 corresponding thereto. For example, the variable resistance structure VR and the switching element SW included in each of the memory cells MC may be connected in series between a corresponding one of the first conductive lines CL1 and a corresponding one of the second conductive lines CL2. In FIG. 2, the switching element SW is disposed above the variable resistance structure VR (e.g., in the third direction D3). However, exemplary embodiments of the present inventive concepts are not limited thereto. In certain exemplary embodiments, the variable resistance structure VR may be disposed above the switching element SW. In addition, a single memory cell array MCA is illustrated in FIG. 2. However, in other exemplary embodiments, a plurality of memory cell arrays may be stacked on a substrate.

Referring again to FIG. 1, cell dummy patterns CDP may be disposed in the cell region CR. In an exemplary embodiment, the cell dummy patterns CDP may be disposed between the memory cell arrays MCA. For example, the cell dummy patterns CDP may be disposed on the substrate 100 and are spaced apart from the memory cell arrays MCA in the first direction D1 and/or second direction D2. Each of the cell dummy patterns CDP may be disposed between the memory cell arrays MCA adjacent to each other. Each of the cell dummy patterns CDP may extend along a side of the memory cell array MCA. Each of the cell dummy patterns CDP may have a line shape extending in a length direction of the memory cell array MCA. For example, each of the cell dummy patterns CDP may extend in the first direction D1 or the second direction D2. The cell dummy patterns CDP may be disposed to surround each of the memory cell arrays MCA in a plan view. The cell dummy patterns CDP may include first cell dummy patterns CDP1 and second cell dummy patterns CDP2. In an exemplary embodiment, the first cell dummy patterns CDP1 may be connected to cell contact plugs 144 to be described later. The second cell dummy patterns CDP2 may not be connected to the cell contact plugs 144.

The cell contact plug 144 may be connected to the first cell dummy pattern CDP1. The first cell dummy pattern CDP1 may be electrically connected to another conductive structure (e.g., a cell conductive pattern to be described later) through the cell contact plug 144. The second cell dummy pattern CDP2 may not be electrically connected to another conductive structure and may be electrically floated. The shapes, numbers and arrangement of the first and second cell dummy patterns CDP1 and CDP2 are illustrated as an example in FIG. 1 and are not limited thereto.

Figure 3A:
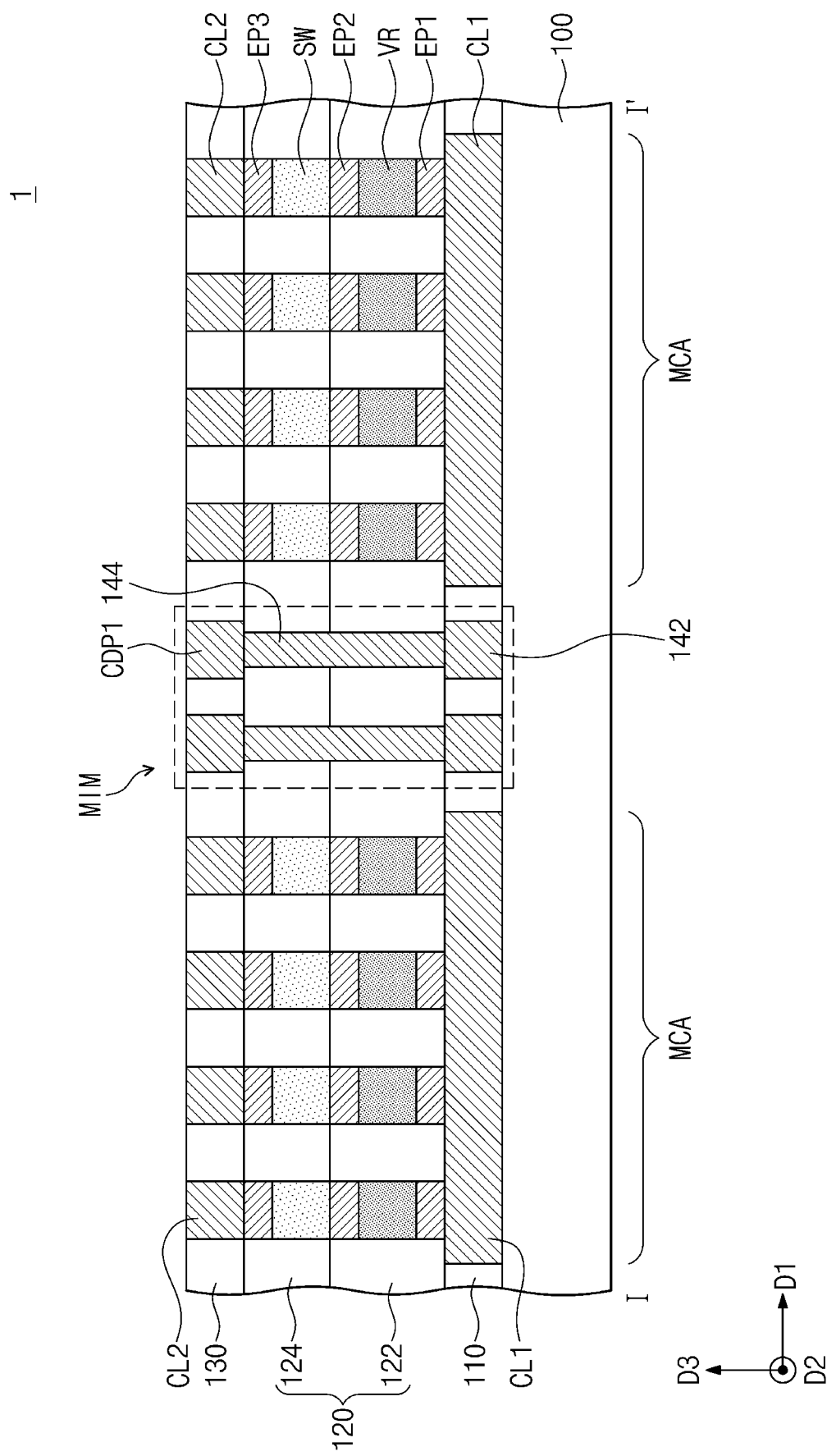
FIG. 3A is a cross-sectional view taken along a line I-I' of FIG. 1 according to an exemplary embodiment of the present inventive concepts.
Figure 3B:
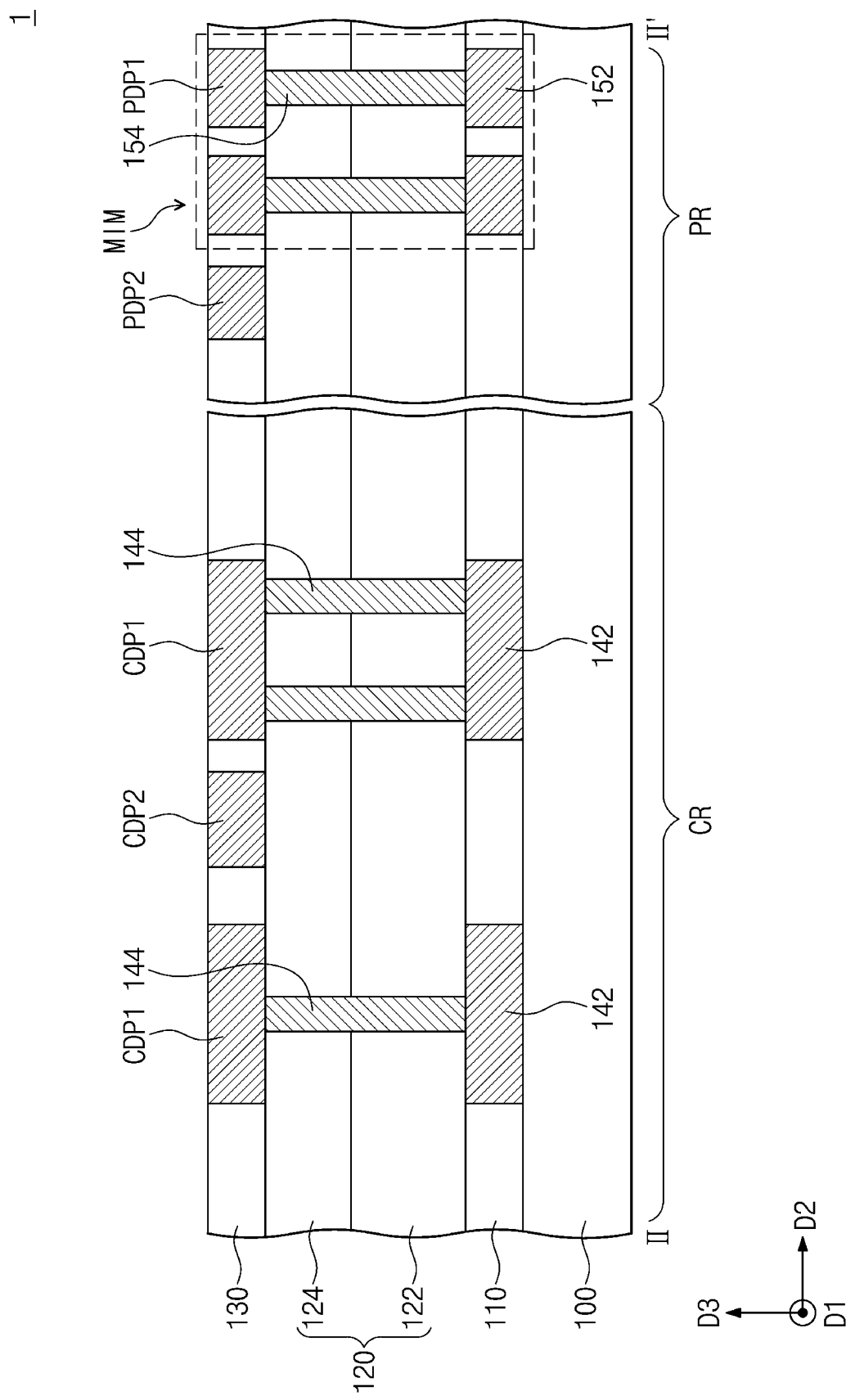
FIG. 3B is a cross-sectional view taken along a line II-II' of FIG. 1 according to an exemplary embodiment of the present inventive concepts.

FIG. 3A is a cross-sectional view taken along a line I-I' of FIG. 1. FIG. 3B is a cross-sectional view taken along a line II-II' of FIG. 1. Referring to FIGS. 1, 2, 3A and 3B, a substrate 100 may include a cell region CR and a peripheral region PR. The first conductive lines CL1 and a lower insulating layer 110 covering the first conductive lines CL1 may be disposed on the substrate 100.

For example, the substrate 100 may be a semiconductor substrate including silicon, germanium, and/or silicon-germanium. The substrate 100 may be a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process.

The first conductive lines CL1 may extend in the first direction D1 and may be spaced apart from each other in the second direction D2. The first conductive lines CL1 may be disposed in the lower insulating layer 110, and the lower insulating layer 110 may expose top surfaces of the first conductive lines CL1.

The first conductive lines CL1 may include a metal (e.g., copper, tungsten, or aluminum) and/or a metal nitride (e.g., tantalum nitride, titanium nitride, or tungsten nitride). For example, the lower insulating layer 110 may include at least one of silicon oxide, silicon nitride, and silicon oxynitride.

The second conductive lines CL2 may be arranged to intersect the first conductive lines CL1. The second conductive lines CL2 may extend in the second direction D2 and may be spaced apart from each other in the first direction D1. The second conductive lines CL2 may be spaced apart from the first conductive lines CL1 in the third direction D3 that is perpendicular to the top surface of the substrate 100. The second conductive lines CL2 may include a metal (e.g., copper, tungsten, or aluminum) and/or a metal nitride (e.g., tantalum nitride, titanium nitride, or tungsten nitride).

As described above, the memory cells MC (see FIG. 2) may be disposed at intersection points of the first conductive lines CL1 and the second conductive lines CL2, respectively. The memory cells MC may be two-dimensionally arranged in the first direction D1 and the second direction D2. The memory cells MC of a specific group may be defined as a memory cell array MCA. For the purpose of ease and convenience in illustration and explanation, the memory cell arrays MCA in a single layer are illustrated. However, in exemplary embodiments, a plurality of the memory cell arrays may be stacked on the substrate 100 and arranged in the third direction D3. In this embodiment, structures corresponding to the memory cell array MCA and the first and second conductive lines CL1 and CL2 may be repeatedly stacked on the substrate 100 and arranged in the third direction D3.

Each of the memory cells MC may include the variable resistance structure VR and the switching element SW, which are connected in series between a corresponding one of the first conductive lines CL1 and a corresponding one of the second conductive lines CL2. In some exemplary embodiments, the variable resistance structure VR may have an island shape which is provided locally at the intersection point of the corresponding first conductive line CL1 and the corresponding second conductive line CL2 and does not extend past the region overlapping the intersection in the first direction D1 or second direction D2. However, in certain embodiments, the variable resistance structure VR may have a line shape extending in the first direction D1 or the second direction D2 past an intersection, unlike FIG. 3A. In this embodiment, the variable resistance structure VR may be shared by a plurality of the memory cells MC arranged in the first direction D1 or the second direction D2.

In some exemplary embodiments, the switching element SW may have an island shape which is provided locally at the intersection point of the corresponding first conductive line CL1 and the corresponding second conductive line CL2 and does not extend past the region overlapping the intersection in the first direction D1 or second direction D2. However, in certain embodiments, the switching element SW may have a line shape extending in the first direction D1 or the second direction D2 past an intersection, unlike FIG. 3A. In this embodiment, the switching element SW may be shared by a plurality of the memory cells MC arranged in the first direction D1 or the second direction D2. The variable resistance structure VR may be provided between the substrate 100 and the switching element SW. However, exemplary embodiments of the inventive concepts are not limited thereto. For example, the switching element SW may be provided between the substrate 100 and the variable resistance structure VR.

The variable resistance structure VR may include a material capable of storing information (or data) using its resistance change. For example, the variable resistance structure VR may include a material of which a phase is reversibly changeable between a crystalline state and an amorphous state based on the temperature of the variable resistance structure. For example, a phase transition temperature between the crystalline and amorphous states of the variable resistance structure VR may range from about 250 degrees Celsius to about 350 degrees Celsius. In these exemplary embodiments, the variable resistance structure VR may include a compound that includes at least one of Te and Se (e.g., chalcogen elements) and at least one of Ge, Sb, Bi, Pb, Sn, Ag, As, S, Si, In, Ti, Ga, P, O, and C. For example, the variable resistance structure VR may include at least one of GeSbTe, GeTeAs, SbTeSe, GeTe, SbTe, SeTeSn, GeTeSe, SbSeBi, GeBiTe, GeTeTi, InSe, GaTeSe, and InSbTe. In certain exemplary embodiments, the variable resistance structure VR may have a superlattice structure in which layers including Ge and layers not including Ge are alternately and repeatedly stacked (e.g., a structure in which GeTe layers and SbTe layers are alternately and repeatedly stacked).

In certain exemplary embodiments, the variable resistance structure VR may include at least one of perovskite compounds and conductive metal oxides. For example, the variable resistance structure VR may include at least one of niobium oxide, titanium oxide, nickel oxide, zirconium oxide, vanadium oxide, $(Pr,Ca)MnO_3$ (PCMO), strontium-titanium oxide, barium-strontium-titanium oxide, strontium-zirconium oxide, barium-zirconium oxide, and barium-strontium-zirconium oxide. In certain exemplary embodiments, the variable resistance structure VR may have a double-layer structure of a conductive metal oxide layer and a tunnel insulating layer or may have a triple-layer structure of a first conductive metal oxide layer, a tunnel insulating layer and a second conductive metal oxide layer. In this embodiment, the tunnel insulating layer may include aluminum oxide, hafnium oxide, or silicon oxide.

The switching element SW may be an element based on a threshold switching phenomenon having a nonlinear I-V curve (e.g., an S-shaped I-V curve). For example, the switching element SW may include an ovonic threshold switch (OTS) element having a bi-directional characteristic. The switching element SW may have a phase transition temperature between crystalline and amorphous states that is higher than that of the variable resistance structure VR. For example, in an exemplary embodiment, the phase transition temperature of the switching element SW may range from about 350 degrees Celsius to about 450 degrees Celsius. Therefore, when the variable resistance memory device according to the exemplary embodiments of the inventive concepts is operated, the phase of the variable resistance structure VR may be reversibly changeable between the crystalline state and the amorphous state while maintaining the temperature below the phase transition temperature of the switching element SW to keep the switching element SW in a substantially amorphous state without a phase change during the process. In the present specification, the term 'substantially amorphous state' may include an amorphous state and may also include a case in which a grain boundary or a crystallized portion locally exists in a portion of a component.

The switching element SW may include a chalcogenide material and impurities. The chalcogenide material may include a compound which includes a chalcogen element (e.g., Te and/or Se) and at least one of Ge, Sb, Bi, Al, Pb, Sn, Ag, As, S, Si, In, Ti, Ga, and P. For example, the chalcogenide material may include at least one of AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, and GeAsBiSe. The impurities may include at least one of C, N, B, and O.

Each of the memory cells MC may further include a connection electrode EP2 disposed between the variable resistance structure VR and the switching element SW. The connection electrode EP2 may electrically connect the variable resistance structure VR and the switching element SW and may prevent the variable resistance structure VR from being in direct contact with the switching element SW. In an exemplary embodiment, the connection electrode EP2 may include at least one of W, Ti, Al, Cu, C, CN, TiN, TiAlN, TiSiN, TiCN, WN, CoSiN, WSiN, TaN, TaCN, and TaSiN.

Each of the memory cells MC may further include a lower electrode EP1 disposed between the variable resistance structure VR and the corresponding first conductive line CL1. The variable resistance structure VR may be electrically connected to the corresponding first conductive line CL1 through the lower electrode EP1. The lower electrode EP1 may be spaced apart from the connection electrode EP2 by the variable resistance structure VR interposed therebetween. In an exemplary embodiment, the lower electrode EP1 may have an island shape locally provided at the intersection point of the corresponding first conductive line CL1 and the corresponding second conductive line CL2 and does not extend past the region overlapping the intersection in the first direction D1 or second direction D2. However, in certain embodiments, the lower electrode EP1 may have a line shape extending in the first direction D1 or second direction D2 past an intersection. The lower electrodes EP1 respectively included in the memory cells MC may be provided at the intersection points of the first conductive lines CL1 and the second conductive lines CL2, respectively, and thus may be two-dimensionally arranged on the substrate 100. The lower electrode EP1 may be a heater electrode which heats the variable resistance structure VR to change the phase of the variable resistance structure VR. The lower electrode EP1 may include a material having a specific resistance that is greater than those of the first and second conductive lines CL1 and CL2. For example, the lower electrode EP1 may include at least one of W, Ti, Al, Cu, C, CN, TiN, TiAlN, TiSiN, TiCN, WN, CoSiN, WSiN, TaN, TaCN, TaSiN, and TiO.

Each of the memory cells MC may further include an upper electrode EP3 disposed between the switching element SW and the corresponding second conductive line CL2. The upper electrode EP3 may electrically connect the switching element SW to the corresponding second conductive line CL2. The upper electrode EP3 may be spaced apart from the connection electrode EP2 by the switching element SW interposed therebetween. The upper electrodes EP3 respectively included in the memory cells MC may be provided at the intersection points of the first conductive lines CL1 and the second conductive lines CL2, respectively, and thus may be two-dimensionally arranged on the substrate 100 (e.g., arranged on the substrate in the first direction D1 and second direction D2 and extending in the third direction D3). The upper electrode EP3 may have an island shape locally provided at the intersection point of the corresponding first conductive line CL1 and the corresponding second conductive CL2 and does not extend past the region overlapping the intersection in the first direction D1 or second direction D2. However, in certain embodiments, the upper electrode EP3 may have a line shape extending in the first direction D1 or the second direction D2 past an intersection. For example, the upper electrode EP3 may have a line shape extending in the extending direction (e.g., the second direction D2) of the corresponding second conductive line CL2, unlike FIG. 3A. In this exemplary embodiment, the upper electrode EP3 may be shared by a plurality of the memory cells MC arranged in the extending direction (e.g., the second direction D2) of the corresponding second conductive line CL2. In an exemplary embodiment, the upper electrode EP3 may include at least one of W, Ti, Al, Cu, C, CN, TiN, TiAlN, TiSiN, TiCN, WN, CoSiN, WSiN, TaN, TaCN, TaSiN, and TiO.

An interlayer insulating layer 120 may be provided on the substrate 100. The interlayer insulating layer 120 may include a first interlayer insulating layer 122 and a second interlayer insulating layer 124 which are sequentially stacked. The first interlayer insulating layer 122 may cover the first conductive lines CL1 and may cover the lower electrode EP1, the variable resistance structure VR and the connection electrode EP2, which are included in each of the memory cells MC. For example, the first interlayer insulating layer 124 may be disposed directly on the first conductive lines CL1 and lower insulating layer 110. The second interlayer insulating layer 124 may be disposed on the first interlayer insulating layer 122. For example, the second interlayer insulating layer 124 may be disposed directly on the first interlayer insulating layer 122 and the connection electrodes EP2. The second interlayer insulating layer 124 may cover the switching element SW and the upper electrode EP3, which are included in each of the memory cells MC. The second conductive lines CL2 may be disposed on the second interlayer insulating layer 124. For example, the second conductive lines CL2 may be disposed directly on the second interlayer insulating layer 124 and the upper electrodes EP3. In an exemplary embodiment, the first and second interlayer insulating layers 122 and 124 may include at least one of silicon oxide, silicon nitride, and silicon oxynitride.

The second conductive lines CL2 may be disposed on the upper electrodes EP3 and the second interlayer insulating layer 124. The second conductive lines CL2 may extend in the second direction D2 and may be spaced apart from each other in the first direction D1.

Referring to FIGS. 1, 3A and 3B, the cell dummy patterns CDP may be disposed between the memory cell arrays MCA. The cell dummy patterns CDP may include the first cell dummy patterns CDP1 and the second cell dummy patterns CDP2. The cell dummy patterns CDP may improve a uniformity of patterns on the substrate 100 to inhibit or prevent pattern collapse of the memory device.

The first cell dummy pattern CDP1 may be provided at an upper insulating layer 130. The first cell dummy pattern CDP1 may be disposed in the upper insulating layer 130. For example a level of the first cell dummy pattern CDP1 may be substantially the same as a level of the second conductive line CL2 described above. In the present specification, the term 'level' may mean a vertical distance from the top surface of the substrate 100 to a surface of a corresponding component. In other words, a top surface of the first cell dummy pattern CDP1 may be substantially coplanar with a top surface of the second conductive line CL2 in the third direction D3. Likewise, a level of a bottom surface of the first cell dummy pattern CDP1 may be substantially the same as a level of a bottom surface of the second conductive line CL2. Accordingly, a thickness of the first cell dummy pattern CDP1 in the third direction D3 may be substantially equal to a thickness of the second conductive line CL2. The first cell dummy patterns CDP1 may include a plurality of adjacent patterns. For example, in the embodiment shown in FIG. 3A, the first cell dummy pattern CDP1 includes a pair of adjacent cell dummy patterns having a substantially identical size. However, exemplary embodiments are not limited thereto, and the first cell dummy pattern CDP1 may include a plurality of first cell dummy patterns having various sizes and arrangements. In an exemplary embodiment, the first cell dummy pattern CDP1 may include at least one of W, Ti, Al, Cu, C, CN, TiN, TiAlN, TiSiN, TiCN, WN, CoSiN, WSiN, TaN, TaCN, TaSiN, and TiO. The first cell dummy pattern CDP1 may be electrically connected to another conductive structure (e.g., a cell conductive pattern 142) through the cell contact plug 144.

The cell contact plug 144 may electrically connect the first cell dummy pattern CDP1 to the cell conductive pattern 142. The cell contact plug 144 may penetrate the second and first interlayer insulating layers 124 and 122 to electrically connect the first cell dummy pattern CDP1 to the cell conductive pattern 142. In an exemplary embodiment, the cell contact plug 144 may include at least one of W, Ti, Al, Cu, C, CN, TiN, TiAlN, TiSiN, TiCN, WN, CoSiN, WSiN, TaN, TaCN, TaSiN, and TiO. The cell contact plug 144 may include a plurality of cell contact plugs horizontally spaced apart from each other under the first cell dummy pattern CDP1. For example, cell contact plug 144 includes two adjacent cell contact plugs connected to the adjacent first cell dummy patterns CDP1 in the exemplary embodiment shown in FIG. 3A. However, in other exemplary embodiments, three or more cell contact plugs may be connected to the first cell dummy patterns CDP1 and may have various sizes and arrangements. When the plurality of cell contact plugs 144 is provided under a single first cell dummy pattern CDP1, an effect similar to an increase in area of an electrode may be obtained.

The cell conductive pattern 142 may be provided in the lower insulating layer 110. The cell conductive pattern 142 may include a plurality of adjacent cell conductive patterns. For example, in the embodiment shown in FIG. 3A, two adjacent cell conductive patterns having a substantially identical size are included. However, exemplary embodiments are not limited thereto, and the cell conductive patterns may include a plurality of cell conductive patterns having various sizes and arrangements. In an exemplary embodiment, the cell conductive pattern 142 may include at least one of W, Ti, Al, Cu, C, CN, TiN, TiAlN, TiSiN, TiCN, WN, CoSiN, WSiN, TaN, TaCN, TaSiN, and TiO. The cell conductive pattern 142 may vertically overlap with the cell contact plug 144 (e.g., the plurality of cell contact plugs). However, the shape and position of the cell conductive pattern 142 are not limited thereto.

Referring to FIG. 3A the first cell dummy patterns CDP1 adjacent to each other, the cell contact plugs 144 respectively connected to the adjacent first cell dummy patterns CDP1, the cell conductive patterns 142 respectively connected to the cell contact plugs 144, and portions of the insulating layers 110, 120 and 130 therebetween may function as a metal-insulator-metal (MIM) capacitor MIM. For example, a first electrode of the MIM capacitor may include one of the adjacent first cell dummy patterns CDP1, the cell contact plug 144 connected to the one of the adjacent first cell dummy patterns CDP1, and the cell conductive pattern 142 connected to the cell contact plug 144. A second electrode of the MIM capacitor may include the other of the adjacent first cell dummy patterns CDP1, the cell contact plug 144 connected to the other of the adjacent first cell dummy patterns CDP1, and the cell conductive pattern 142 connected to the cell contact plug 144. The portions of the insulating layers between the first and second electrodes may function as an insulator between the first and second electrodes.

The second cell dummy pattern CDP2 may be provided at the upper insulating layer 130. As shown in FIG. 3B, the second cell dummy pattern CDP2 may be disposed in the upper insulating layer 130. A level of the second cell dummy pattern CDP2 may be substantially the same as the level of the second conductive line CL2 described above. A thickness of the second cell dummy pattern CDP2 may be substantially equal to the thickness of the second conductive line CL2. In an exemplary embodiment, the second cell dummy pattern CDP2 may include at least one of W, Ti, Al, Cu, C, CN, TiN, TiAlN, TiSiN, TiCN, WN, CoSiN, WSiN, TaN, TaCN, TaSiN, and TiO. The second cell dummy pattern CDP2 may not be electrically connected to another conductive structure and may be electrically floated.

The lower insulating layer 110, the first and second interlayer insulating layers 122 and 124 and the upper insulating layer 130, described above, may also be provided on the substrate 100 of the peripheral region PR. Peripheral dummy patterns PDP may be disposed on the substrate 100 of the peripheral region PR. In an exemplary embodiment, the peripheral dummy patterns PDP may include first peripheral dummy patterns PDP1 and second peripheral dummy patterns PDP2.

The first peripheral dummy pattern PDP1 may be provided in the upper insulating layer 130. The first peripheral dummy pattern PDP1 may have substantially the same or similar structure as the first cell dummy pattern CDP1 described above. The first peripheral dummy pattern PDP1 may include a plurality of adjacent patterns. For example, in the embodiment shown in FIG. 3B, the first peripheral dummy pattern PDP1 includes a pair of adjacent first peripheral dummy patterns having a substantially identical size. However, exemplary embodiments are not limited thereto, and the first peripheral dummy pattern PDP1 may include a plurality of first cell dummy patterns having various sizes and arrangements. A level of a top surface of the first peripheral dummy pattern PDP1 may be substantially the same as the level of the top surface of the second conductive line CL2 described above. For example, the top surface of the first peripheral dummy pattern PDP1 may be substantially coplanar with the top surface of the second conductive line CL2. A level of a bottom surface of the first peripheral dummy pattern PDP1 may be substantially the same as the level of the bottom surface of the second conductive line CL2. Accordingly, a thickness of the first peripheral dummy pattern PDP1 may be substantially equal to the thickness of the second conductive line CL2. In an exemplary embodiment, the first peripheral dummy pattern PDP1 may include at least one of W, Ti, Al, Cu, C, CN, TiN, TiAlN, TiSiN, TiCN, WN, CoSiN, WSiN, TaN, TaCN, TaSiN, and TiO. The first peripheral dummy pattern PDP1 may be electrically connected to another conductive structure (e.g., a peripheral conductive pattern 152) through a peripheral contact plug 154.

The peripheral contact plug 154 may electrically connect the first peripheral dummy pattern PDP1 to the peripheral conductive pattern 152. The peripheral contact plug 154 may penetrate the second and first interlayer insulating layers 124 and 122 to electrically connect the first peripheral dummy pattern PDP1 to the peripheral conductive pattern 152. In an exemplary embodiment, the peripheral contact plug 154 may include at least one of W, Ti, Al, Cu, C, CN, TiN, TiAlN, TiSiN, TiCN, WN, CoSiN, WSiN, TaN, TaCN, TaSiN, and TiO. The peripheral contact plug 154 may include a plurality of peripheral contact plugs 154 horizontally spaced apart from each other under the first peripheral dummy pattern PDP1. For example, the peripheral contact plug 154 includes two adjacent peripheral contact plugs connected to the adjacent first peripheral dummy patterns PDP1 in the exemplary embodiment shown in FIG. 3B. However, in other exemplary embodiments, three or more peripheral contact plugs may be connected to the first peripheral dummy patterns PDP1 and may have various sizes and arrangements.

The peripheral conductive pattern 152 may be provided in the lower insulating layer 110 in the peripheral region PR. In an exemplary embodiment, the peripheral conductive pattern 152 may include at least one of W, Ti, Al, Cu, C, CN, TiN, TiAlN, TiSiN, TiCN, WN, CoSiN, WSiN, TaN, TaCN, TaSiN, and TiO. The peripheral conductive pattern 152 may vertically overlap with the peripheral contact plug 154. However, the shape and position of the peripheral conductive pattern 152 are not limited thereto. The peripheral conductive pattern 152 may include a plurality of adjacent peripheral conductive patterns. For example, in the embodiment shown in FIG. 3B, two adjacent peripheral conductive patterns having a substantially identical size are included. However, exemplary embodiments are not limited thereto, and the peripheral conductive patterns may include a plurality of peripheral conductive patterns having various sizes and arrangements.

Referring to FIG. 3B, the first peripheral dummy patterns PDP1 adjacent to each other, the peripheral contact plugs 154 respectively connected to the adjacent first peripheral dummy patterns PDP1, the adjacent peripheral conductive patterns 152 respectively connected to the peripheral contact plugs 154, and portions of the insulating layers 110, 120 and 130 therebetween may function as a metal-insulator-metal (MIM) capacitor MIM. For example, a first electrode of the MIM capacitor may include one of the adjacent first peripheral dummy patterns PDP1, the peripheral contact plug 154 connected to the one of the adjacent first peripheral dummy patterns PDP1, and the peripheral conductive pattern 152 connected to the peripheral contact plug 154. A second electrode of the MIM capacitor may include the other of the adjacent first peripheral dummy patterns PDP1, the peripheral contact plug 154 connected to the other of the adjacent first peripheral dummy patterns PDP1, and the peripheral conductive pattern 152 connected to the peripheral contact plug 154. The portions of the insulating layers between the first and second electrodes may function as an insulator between the first and second electrodes.

The second peripheral dummy pattern PDP2 may not be electrically connected to another conductive structure and may be electrically floated. The peripheral region PR may have the same layer structure as the cell region CR in FIG. 3B. Alternatively, in other exemplary embodiments, the peripheral region PR may have a different layer structure from that of the cell region CR. For example, the peripheral region PR may include only some of the layers provided in the cell region CR.

According to the exemplary embodiments of the present inventive concepts, at least some of the dummy patterns CDP and PDP may be used as the MIM capacitor. For example, the first cell dummy patterns CDP1 disposed between the memory cell arrays MCA may be used as the MIM capacitor. Therefore, an additional capacitor (e.g., a MOS capacitor) may not be provided, or the number of additional capacitors may be reduced. As a result, a chip size of the semiconductor device may be reduced, and a yield and reliability of the semiconductor device may be improved.

Figure 4A:
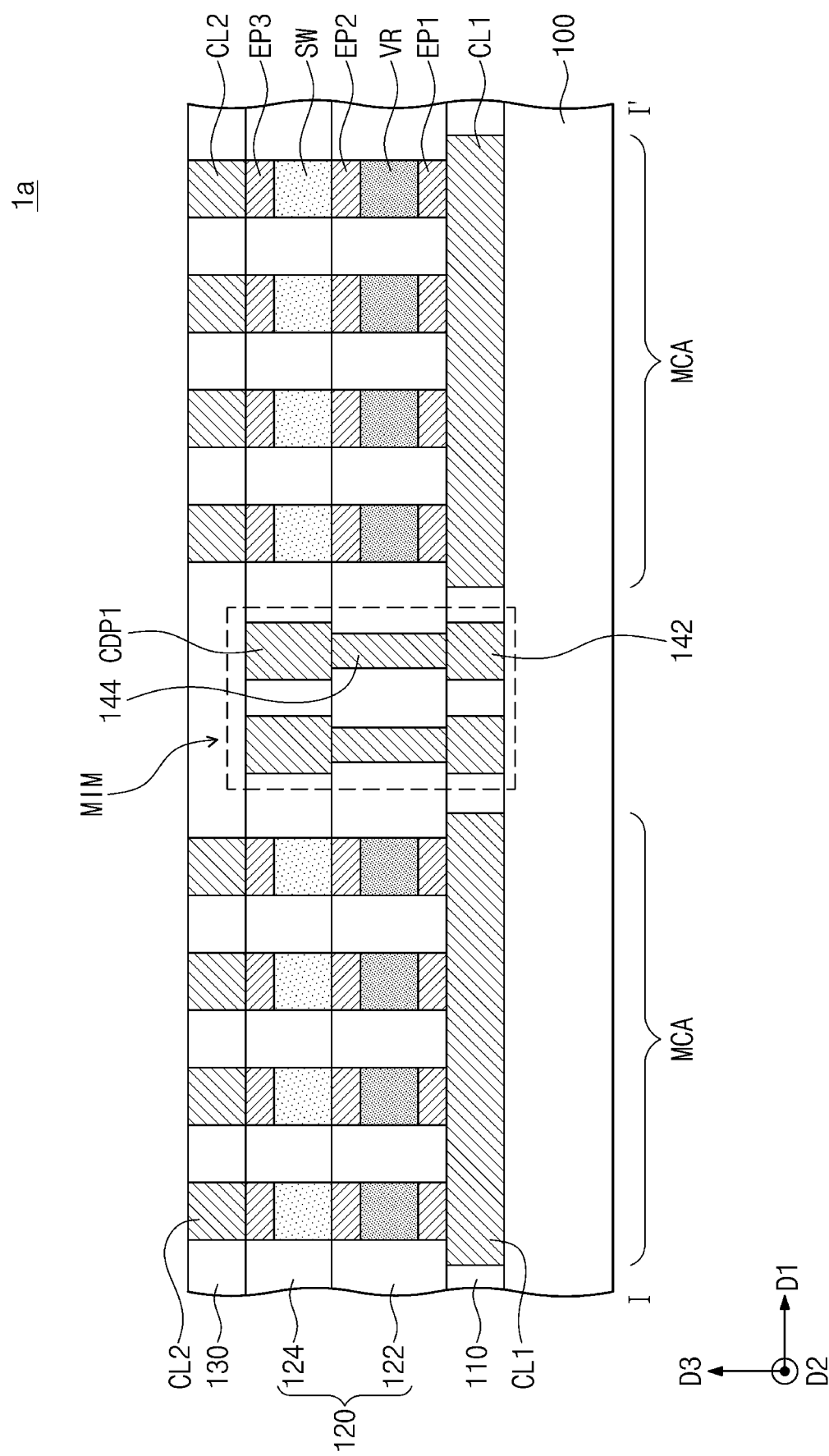
FIGS. 4A and 4B are cross-sectional views illustrating a semiconductor device according to an exemplary embodiment of the present inventive concepts.
Figure 4B:
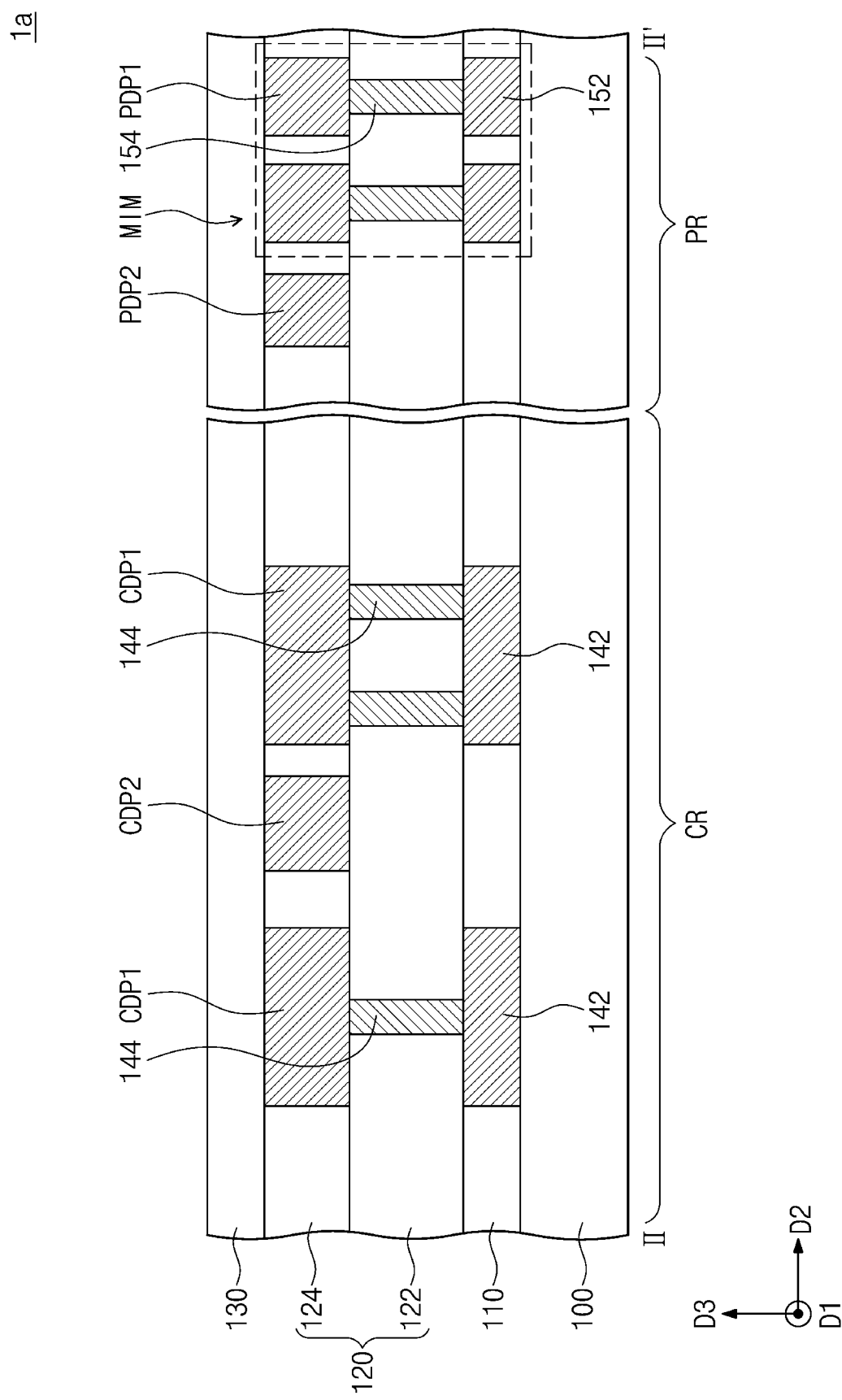

FIGS. 4A and 4B are cross-sectional views illustrating a semiconductor device 1a according to some exemplary embodiments of the present inventive concepts, FIGS. 4A and 4B may be cross-sectional views corresponding to the lines I-I' and II-II' of FIG. 1, respectively. Hereinafter, the same or similar components as in the exemplary embodiments of FIGS. 3A and 3B will be indicated by the same reference numerals or designators, and detailed descriptions thereto will be omitted.

Referring to FIGS. 4A and 4B, a first cell dummy pattern CDP1 of the semiconductor device 1a may be provided at the second interlayer insulating layer 124 and may not extend to a level of the second conductive line CL2. For example, the first cell dummy pattern CDP1 may be provided in the second interlayer insulating layer 124. A thickness of the first cell dummy pattern CDP1 may be substantially equal to a thickness of the switching element SW described above. However, the thickness of the first cell dummy pattern CDP1 is not limited thereto. For example, in the exemplary embodiment shown in FIG. 4A, the thickness of the first cell dummy pattern CDP1 is substantially equal to a sum of the thicknesses of the switching element SW and the upper electrode EP3. In an exemplary embodiment, the first cell dummy pattern CDP1 of the semiconductor device 1a may include at least one of W, Ti, Al, Cu, C, CN, TiN, TiAlN, TiSiN, TiCN, WN, CoSiN, WSiN, TaN, TaCN, TaSiN, and TiO. The first cell dummy pattern CDP1 may be electrically connected to another conductive structure (e.g., a cell conductive pattern 142) through a cell contact plug 144. The cell dummy patterns CDP may inhibit or prevent pattern collapse of the memory device in a planarization process of the memory device. For example, the cell dummy patterns CDP may improve a uniformity of patterns on the substrate 100 to inhibit or prevent the pattern collapse of the memory device. In the exemplary embodiment shown in FIG. 4A, the device 1a includes two adjacent cell dummy patterns CDP1, two adjacent cell contact plugs 144 and two adjacent cell conductive patterns 142. However, exemplary embodiments are not limited thereto.

A second cell dummy pattern CDP2 may be provided at the second interlayer insulating layer 124. The second cell dummy pattern CDP2 may be disposed in the second interlayer insulating layer 124. A thickness of the second cell dummy pattern CDP2 may be substantially equal to the thickness of the switching element SW. However, the thickness of the second cell dummy pattern CDP2 is not limited thereto. For example, in the exemplary embodiment shown in FIG. 4B, the thickness of the second cell dummy pattern CDP2 may be substantially equal to the sum of the thicknesses of the switching element SW and the upper electrode EP3.

A first peripheral dummy pattern PDP1 may be provided at the second interlayer insulating layer 124. For example, the first peripheral dummy pattern PDP1 may be disposed in the second interlayer insulating layer 124. A level of a top surface of the first peripheral dummy pattern PDP1 may be substantially the same as a level of a top surface of the switching element SW or the upper electrode EP3.

A second peripheral dummy pattern PDP2 may be provided at the second interlayer insulating layer 124. For example, the second peripheral dummy pattern PDP2 may be disposed in the second interlayer insulating layer 124. A level of a top surface of the second peripheral dummy pattern PDP2 may be substantially the same as the level of the top surface of the switching element SW or the upper electrode EP3.

The cell dummy patterns CDP and the peripheral dummy patterns PDP are provided in the second interlayer insulating layer 124 in FIGS. 4A and 4B. Alternatively, the cell dummy patterns CDP and the peripheral dummy patterns PDP may be provided in the first interlayer insulating layer 122 or in the first and second interlayer insulating layers 122 and 124.

Figure 5A:
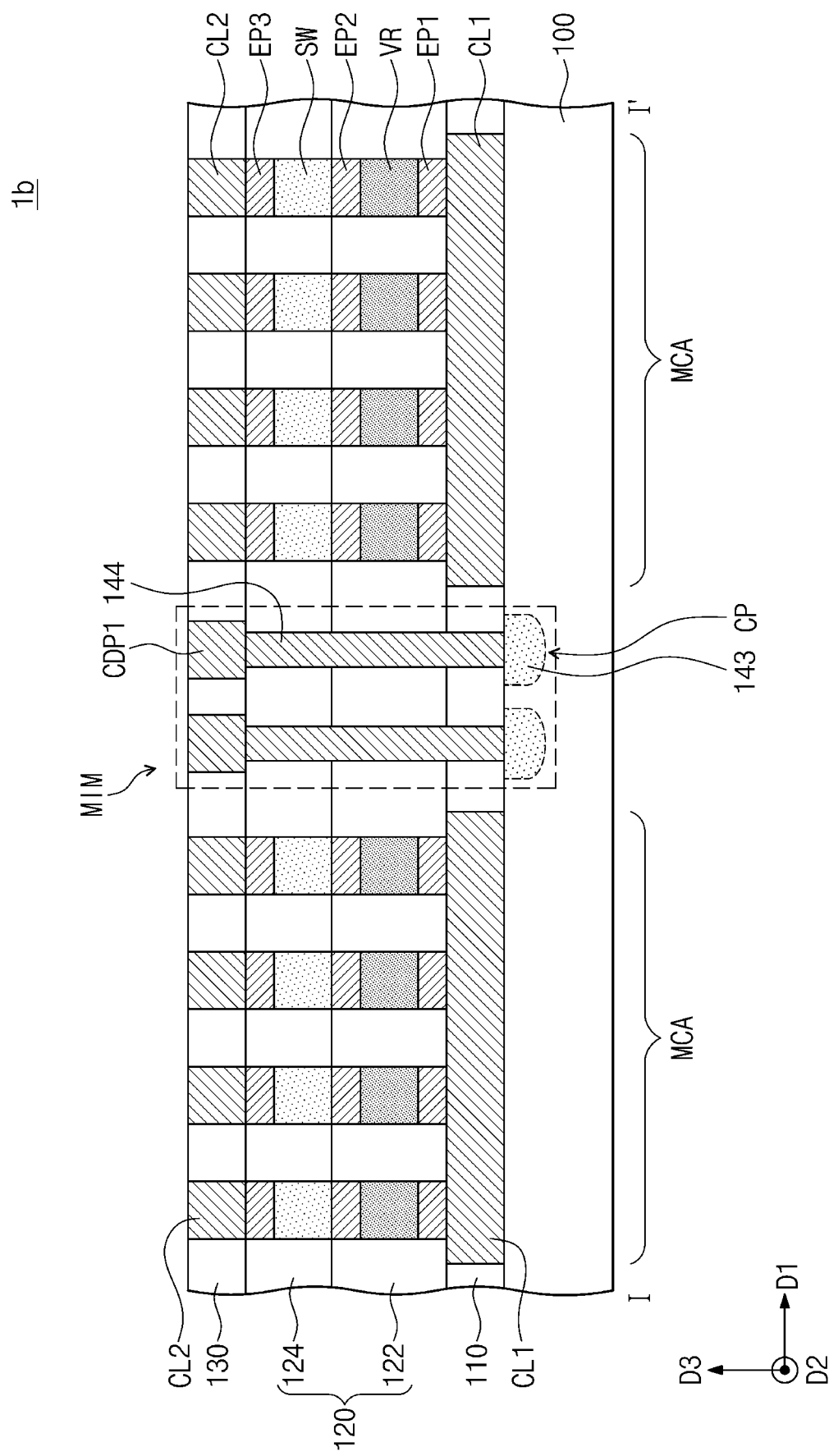
FIGS. 5A and 5B are cross-sectional views illustrating a semiconductor device according to exemplary embodiments of the present inventive concepts.
Figure 5B:
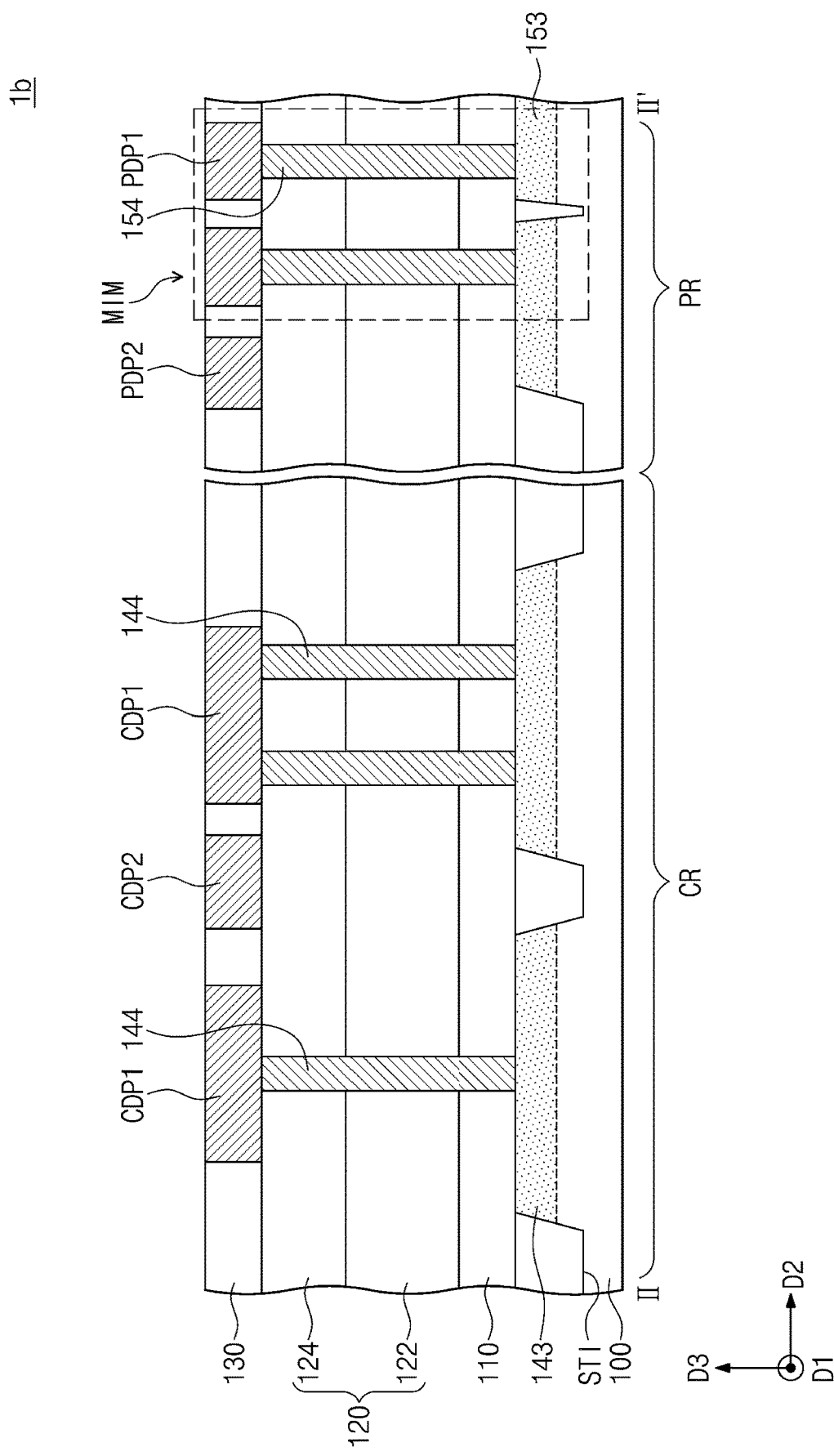

FIGS. 5A and 5B are cross-sectional views illustrating a semiconductor device 1b according to some exemplary embodiments of the present inventive concepts. FIGS. 5A and 5B may be cross-sectional views corresponding to the lines and of FIG. 1, respectively. Hereinafter, the same or similar components as in the exemplary embodiments of FIGS. 3A and 3B will be indicated by the same reference numerals or designators, and detailed descriptions thereto will be omitted.

Referring to FIGS. 5A and 5B, the semiconductor device 1b may include an active region 143. The active region 143 may be a region between device isolation regions STI disposed in the substrate 100. For example, the active region 143 may be a dopant region that is doped with dopants. A cell contact plug 144 may electrically connect the first cell dummy pattern CDP1 to the active region 143. The active region 143 of the cell region CR may correspond to the cell conductive pattern 142 described above. The cell contact plug 144 may penetrate the lower insulating layer 110 and the first and second interlayer insulating layers 122 and 124. A peripheral contact plug 154 may electrically connect the first peripheral dummy pattern PDP1 to an active region 153 of the peripheral region PR. The active region 153 of the peripheral region PR may correspond to the peripheral conductive pattern described above. The peripheral contact plug 154 may penetrate the lower insulating layer 110 and the first and second interlayer insulating layers 122 and 124.

According to the present embodiments, penetration lengths of the cell contact plugs 144 penetrating the insulating layers may increase to obtain an effect corresponding to an increase in the area of the electrodes of the MIM capacitor. Penetration lengths of the peripheral contact plugs 154 penetrating the insulating layers may increase to obtain an effect corresponding to an increase in the area of the electrodes of the MIM capacitor. Therefore, the capacitances of the MIM capacitors may be increased.

Figure 6A:
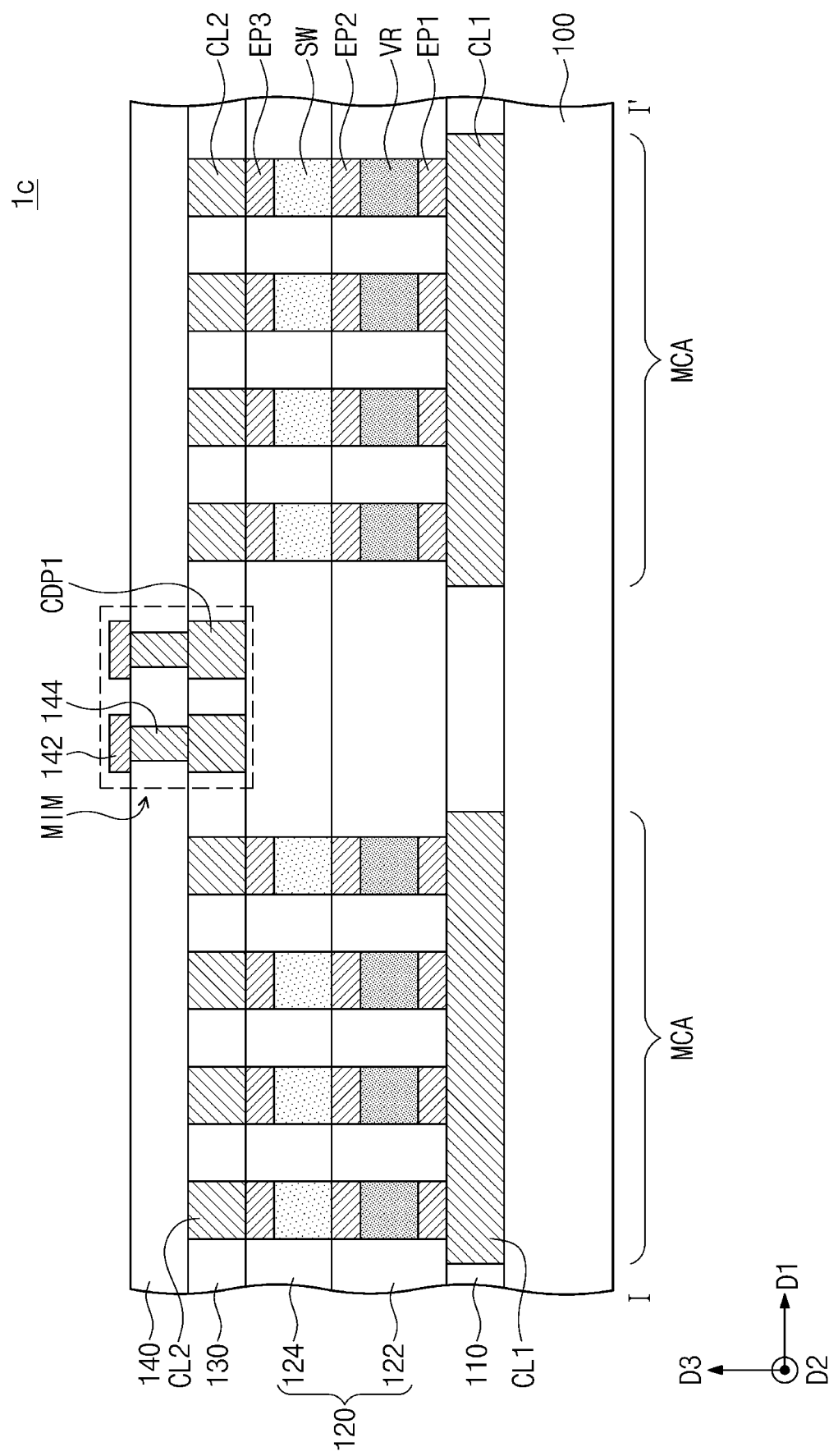
FIGS. 6A and 6B are cross-sectional views illustrating a semiconductor device according to exemplary embodiments of the present inventive concepts.
Figure 6B:
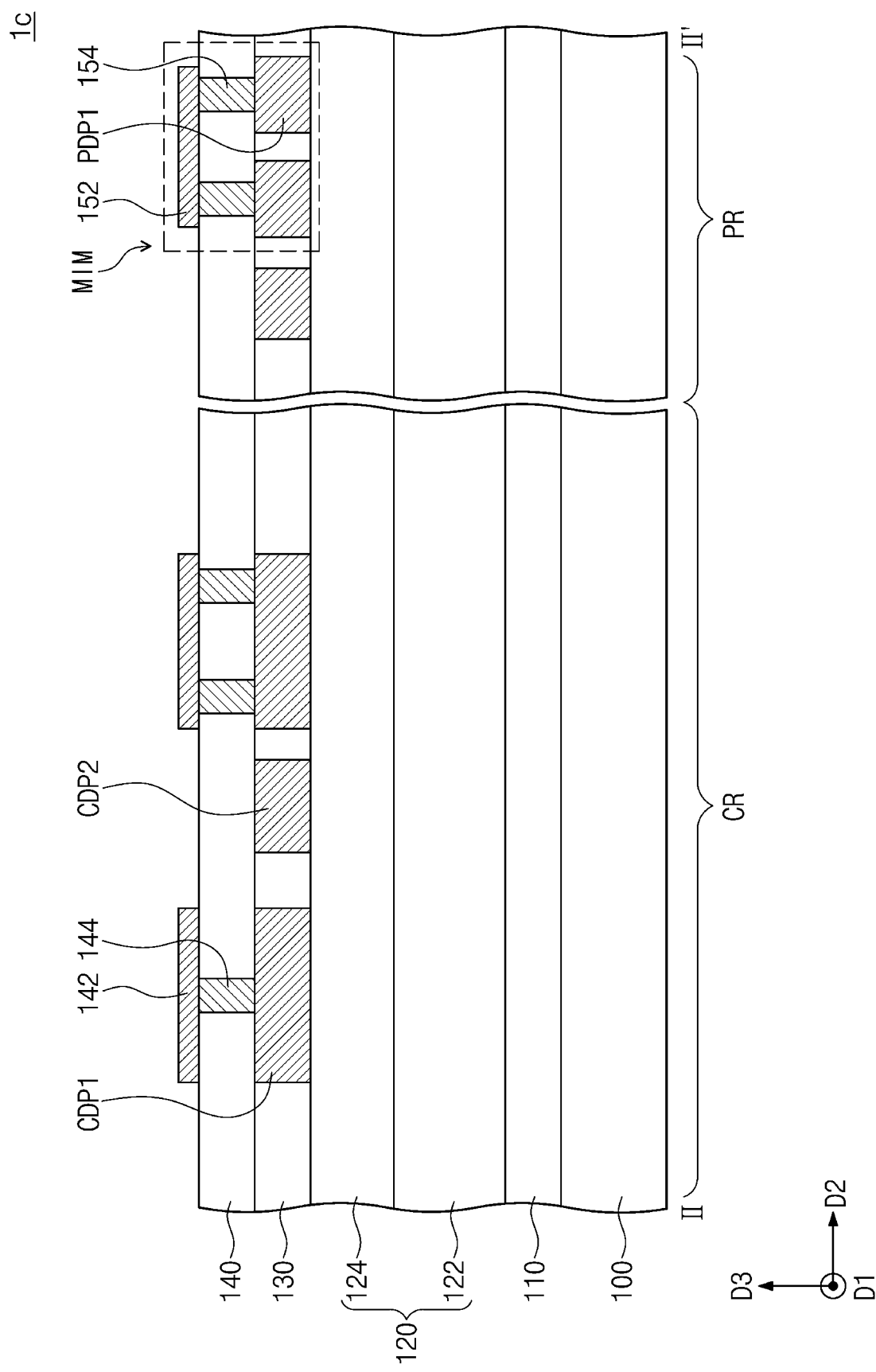

FIGS. 6A and 6B are cross-sectional views illustrating a semiconductor device 1c according to some exemplary embodiments of the present inventive concepts. FIGS. 6A and 6B may be cross-sectional views corresponding to the lines I-I' and II-II' of FIG. 1, respectively. Hereinafter, the same or similar components as in the exemplary embodiments of FIGS. 3A and 3B will be indicated by the same reference numerals or designators, and detailed descriptions thereto will be omitted.

Referring to FIGS. 6A and 6B, the semiconductor device 1c may further include an additional insulating layer 140 disposed on the upper insulating layer 130. For example, the additional insulating layer 140 may be disposed directly on the upper insulating layer 130 and second conductive lines CL2. A cell conductive pattern 142 may be provided on the additional insulating layer 140. For example, the cell conductive pattern 142 may be disposed directly on the additional insulating layer 140. The cell conductive pattern 142 may comprise a plurality of adjacent cell conductive patterns. For example, in the embodiment shown in FIG. 6A, two adjacent cell conductive patterns 142 having a substantially identical size are included. However, exemplary embodiments are not limited thereto. A cell contact plug 144 may penetrate the additional insulating layer 140 to electrically connect the cell conductive pattern 142 to the first cell dummy pattern CDP1. In the exemplary embodiment shown in FIG. 6A, the cell contact plug 144 includes two adjacent cell contact plugs connected to the adjacent first cell dummy patterns CDP1. However, exemplary embodiments are not limited thereto.

As shown in FIG. 6B, a peripheral conductive pattern 152 may be provided on the additional insulating layer 140. For example, the peripheral conductive pattern 152 may be disposed directly on the additional insulating layer 140. The peripheral conductive pattern 152 may include a single peripheral conductive pattern as shown in FIG. 6B or may include a plurality of spaced apart peripheral conductive patterns. A peripheral contact plug 154 may penetrate the additional insulating layer 140 to electrically connect the peripheral conductive pattern 152 to the first peripheral dummy pattern PDP1. In the exemplary embodiment shown in FIG. 6B, the peripheral contact plug 154 includes two adjacent peripheral contact plugs connected to a pair of adjacent first peripheral dummy patterns PDP1. However, exemplary embodiments are not limited thereto.

According to the present exemplary embodiments, penetration lengths of the cell contact plugs 144 may be increased by adjusting a thickness of the additional insulating layer 140, thereby obtaining an effect corresponding to an increase in the area of electrodes of an MIM capacitor. In addition, the penetration lengths of the peripheral contact plugs 154 may also be increased to obtain an effect corresponding to an increase in area of electrodes of an MIM capacitor. Thus, capacitances of the MIM capacitors may be increased. In addition, a degree of freedom of interconnection lines may be increased to various modify the shape of the MIM capacitor.

As described above, the semiconductor device may include the MIM capacitors of which the structures and arrangement may be variously modified. The structures and arrangements of the MIM capacitors are suitable to both the cell region and the peripheral region. Accordingly, the degree of freedom of the interconnection lines and performance of the semiconductor device may be improved.

The memory cell arrays MCA arranged in a single layer are illustrated as an example in the drawings. However, alternatively, the exemplary embodiments of the present inventive concepts may also be applied to a memory cell array stack having a multi-layered structure. In this embodiment, the penetration lengths of the contact plugs may be increased, and thus the capacitances of the MIM capacitors may be increased. In certain exemplary embodiments, the conductive patterns 142 and 152 may be disposed in an insulating layer between the substrate 100 and the first conductive lines CL1. Accordingly, the positions and functions of the conductive patterns electrically connected to the dummy patterns through the contact plugs may be variously modified or changed.

According to the exemplary embodiments of the present inventive concepts, at least some of the dummy patterns may be used as the MIM capacitor. For example, the first cell dummy patterns disposed between the memory cell arrays may be used as the MIM capacitor.

Therefore, an additional capacitor (e.g., a MOS capacitor) may not be provided, or the number of additional capacitors may be reduced. The structures and arrangement of the MIM capacitors may be variously modified or changed, and thus the degree of freedom of interconnection lines may be increased. In addition, the chip size of the semiconductor device may be reduced, and the yield and reliability of the semiconductor device may be improved.

While the present inventive concepts have been described with reference to exemplary embodiments, it will be apparent to those skilled in the art that various changes and modifications may be made without departing from the spirits and scopes of the present inventive concepts. Therefore, it should be understood that the above exemplary embodiments are not limiting, but illustrative. Accordingly, the scopes of the present inventive concepts are to be determined by the broadest permissible interpretation of the following claims and their equivalents, and shall not be restricted or limited by the foregoing description.

What is claimed is:

1. A semiconductor device comprising:
   a substrate;
   memory cell arrays arranged on the substrate in a first direction and a second direction, the first direction and the second direction are parallel to a top surface of the substrate and intersect each other, wherein the memory cell arrays include a plurality of memory cells;
   a cell dummy pattern on the substrate and arranged between the memory cell arrays in at least one of the first direction and the second direction and having a line in shape extending in a length direction along a side of the memory cell arrays;
   a cell conductive pattern on the substrate; and
   a cell contact plug configured to connect the cell dummy pattern and the cell conductive pattern, the cell contact plug is arranged between the cell dummy pattern and the cell conductive pattern in a third direction that is perpendicular to the first direction and the second direction.

2. The semiconductor device of claim 1, further comprising:
   an upper interconnection line on the memory cells;
   an interlayer insulating layer covering the memory cells on the substrate; and
   an upper insulating layer covering the upper interconnection line on the interlayer insulating layer,
   wherein the cell dummy pattern is disposed in the upper insulating layer.

3. The semiconductor device of claim 2, further comprising;
   a lower interconnection line under the memory cells; and
   a lower insulating layer covering the lower interconnection line between the substrate and the interlayer insulating layer,
   wherein the cell conductive pattern is disposed in the lower insulating layer.

4. The semiconductor device of claim 1, wherein:
   the cell dummy pattern includes a plurality of cell dummy patterns and the cell conductive pattern includes a plurality of cell conductive patterns; and
   adjacent cell dummy patterns of the plurality of cell dummy patterns, the cell contact plug connected to the adjacent cell dummy patterns, a portion of an interlayer insulating layer between the cell contact plug, and adjacent cell conductive patterns of the plurality of cell conductive patterns connected to the cell contact plug function as a metal-insulator-metal (MIM) capacitor.

5. The semiconductor device of claim 1, wherein the cell contact plug includes a plurality of cell contact plugs connected to the cell dummy pattern, the plurality of cell contact plugs horizontally spaced apart from each other.

6. The semiconductor device of claim 1, further comprising:
   an interlayer insulating layer covering the memory cells, wherein the cell dummy pattern is disposed in the interlayer insulating layer.

7. The semiconductor device of claim 1, wherein the cell conductive pattern is an active region formed in the substrate, and
   wherein the cell contact plug is configured to connect the cell dummy pattern and the active region.

8. The semiconductor device of claim 2, further comprising:
   an additional insulating layer on the upper insulating layer,
   wherein the cell conductive pattern is disposed on the additional insulating layer.

9. The semiconductor device of claim 1, wherein the cell dummy pattern is a first cell dummy pattern, the semiconductor device further comprising:
   a second cell dummy pattern arranged between the memory cell arrays in at least one of the first direction and the second direction, wherein the second cell dummy pattern is electrically floated.

10. The semiconductor device of claim 9, wherein each of the first and second cell dummy patterns extends in a length direction of the memory cell array between the memory cell arrays.

11. The semiconductor device of claim 10, wherein the first and second cell dummy patterns are disposed to surround each of the memory cell arrays in the first direction and the second direction.

12. The semiconductor device of claim 1, wherein the semiconductor device includes a cell region and a peripheral region, and the memory cell arrays and the cell dummy pattern are formed in the cell region,
    wherein the peripheral region comprises:
    a peripheral dummy pattern on the substrate;
    a peripheral conductive pattern on the substrate; and
    a peripheral contact plug configured to connect the peripheral dummy pattern and the peripheral conductive pattern;
    wherein a distance between a top surface of the peripheral dummy pattern to the top surface of the substrate is substantially the same as a distance between a top surface of the cell dummy pattern to the top surface of the substrate.

13. The semiconductor device of claim 12, wherein:
    the peripheral dummy pattern includes a plurality of peripheral dummy patterns and the peripheral conductive pattern includes a plurality of peripheral conductive patterns; and
    adjacent peripheral dummy patterns of the plurality of peripheral dummy patterns, a peripheral contact plug connected to the adjacent peripheral dummy patterns, a portion of an insulating layer between the peripheral contact plug, and adjacent peripheral conductive patterns of the plurality peripheral conductive patterns connected to the peripheral contact plug function as a metal-insulator-metal (MIM) capacitor.

14. The semiconductor device of claim 1, wherein the semiconductor device includes a cell region and a peripheral region, and the memory cell arrays and the cell dummy pattern are formed in the cell region,
    wherein the peripheral region comprises:
    a peripheral dummy pattern on the substrate;
    an active region provided in the substrate; and
    a peripheral contact plug configured to connect the peripheral dummy pattern and the active region.

15. The semiconductor device of claim 2, wherein a distance between a top surface of the cell dummy pattern to the top surface of the substrate is substantially the same as a distance between a top surface of the upper insulating layer to the top surface of the substrate.

16. The semiconductor device of claim 3, wherein a distance between a top surface of the cell conductive pattern to the top surface of the substrate is substantially the same as a distance between a top surface of the lower interconnection line and the top surface of the substrate.

17. A metal-insulator-metal (MIM) capacitor comprising:
    a first electrode, a second electrode, and an insulator between the first electrode and the second electrode, wherein each of the first and second electrodes comprises:
a dummy pattern disposed between memory cell arrays horizontally arranged on an insulating layer and having a line shape extending in a length direction along a side of the memory cell arrays; and
a contact plug penetrating the insulating layer to connect the dummy pattern and a conductive pattern under the insulating layer,
wherein the insulator is a portion of the insulating layer between the first and second electrodes.

18. The MIM capacitor of claim 17, wherein each of the memory cell arrays includes a plurality of memory cells, wherein:
the insulating layer comprises an interlayer insulating layer covering the memory cells, and
the dummy pattern is disposed on the interlayer insulating layer.

19. The MEM capacitor of claim 18, further comprising:
an upper interconnection line disposed on the memory cells and the interlayer insulating layer and configured to electrically connect to the memory cells, and
the insulating layer further comprising an upper insulating layer covering the upper interconnection line on the interlayer insulating layer,
wherein the dummy pattern is disposed in the upper insulating layer.

20. The MIM capacitor of claim 17, wherein the contact plug includes a plurality of contact plugs connected to the dummy pattern, the plurality of contact plugs horizontally spaced apart from each other.

\* \* \* \* \*